United States Patent
Agarwal et al.

(10) Patent No.: US 10,153,224 B2
(45) Date of Patent: Dec. 11, 2018

(54) BACKSIDE SPACER STRUCTURES FOR IMPROVED THERMAL PERFORMANCE

(71) Applicant: GLOBALFOUNDRIES Inc., Grand Cayman (KY)

(72) Inventors: Rahul Agarwal, Waterford, NY (US); Luke England, Saratoga Springs, NY (US); Haojun Zhang, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 27 days.

(21) Appl. No.: 15/264,957

(22) Filed: Sep. 14, 2016

(65) Prior Publication Data
US 2018/0076110 A1 Mar. 15, 2018

(51) Int. Cl.
*H01L 23/367* (2006.01)
*H01L 23/00* (2006.01)
*H01L 21/288* (2006.01)

(52) U.S. Cl.
CPC ...... *H01L 23/3675* (2013.01); *H01L 21/2885* (2013.01); *H01L 24/27* (2013.01); *H01L 24/32* (2013.01); *H01L 24/83* (2013.01); *H01L 2224/26122* (2013.01); *H01L 2224/27011* (2013.01); *H01L 2224/32245* (2013.01); *H01L 2224/83007* (2013.01); *H01L 2924/14* (2013.01)

(58) Field of Classification Search
CPC .................. H01L 21/2885; H01L 23/3675
See application file for complete search history.

(56) References Cited

U.S. PATENT DOCUMENTS

| | | | |
|---|---|---|---|
| 6,965,513 B2 | 11/2005 | Montgomery et al. | |
| 7,030,485 B2* | 4/2006 | Houle | H01L 23/3736 257/706 |
| 7,168,484 B2* | 1/2007 | Zhang | B82Y 10/00 165/104.33 |
| 7,355,289 B2 | 4/2008 | Hess et al. | |
| 7,795,725 B2* | 9/2010 | Mouli | H01L 23/367 257/675 |
| 8,409,929 B2 | 4/2013 | Renavikar et al. | |
| 8,749,979 B2* | 6/2014 | Iwai | H01L 23/373 361/705 |
| 2004/0164402 A1* | 8/2004 | Yoshimura | H01L 23/3737 257/706 |
| 2008/0310115 A1 | 12/2008 | Brandenburg et al. | |
| 2010/0295178 A1* | 11/2010 | Ishihara | H01L 21/6835 257/737 |
| 2012/0217628 A1* | 8/2012 | Chou | H01L 23/3677 257/692 |
| 2012/0285673 A1 | 11/2012 | Cola et al. | |

(Continued)

*Primary Examiner* — Andres Munoz
(74) *Attorney, Agent, or Firm* — Ditthavong & Steiner, P.C.

(57) ABSTRACT

Methods for reducing the junction temperature between an IC chip and its lid by including metal spacers in the TIM layer and the resulting devices are disclosed. Embodiments include providing a substrate, including integrated circuit devices, having front and back sides; forming vertical spacers on the backside of the substrate; providing a plate parallel to and spaced from the backside of the substrate; and forming a TIM layer, surrounding the vertical spacers, between the backside of the substrate and the plate.

9 Claims, 5 Drawing Sheets

(56) References Cited

U.S. PATENT DOCUMENTS

| | | | |
|---|---|---|---|
| 2012/0305633 A1* | 12/2012 | Feger | B23K 1/0016 228/203 |
| 2013/0081796 A1* | 4/2013 | Horiuchi | H01L 23/3677 165/185 |
| 2014/0138854 A1 | 5/2014 | Arora | |
| 2015/0235979 A1* | 8/2015 | Erwin | H01L 24/17 257/737 |

* cited by examiner

BACKSIDE SPACER STRUCTURES FOR IMPROVED THERMAL PERFORMANCE

TECHNICAL FIELD

The present disclosure relates generally to designing and fabricating integrated circuit (IC) devices. The present disclosure is particularly applicable to improving thermal performance of an IC package.

BACKGROUND

Advancements in design and fabrication processes of IC devices allow semiconductor manufacturers to increase the component density in integrated circuits and deliver smaller scaled IC devices. An IC die/chip may be encased in a final package (e.g. plastic casing) or may be used as a bare chip (e.g. flip-chip) for direct placement onto a printed circuit board (PCB) of an electronic device. Generally, as operations of the components (e.g. transistors) in an IC chip generate heat, the backside of the IC chip may be bonded, by a thermal interface material (TIM) layer, to a plate/lid for transferring the generated heat to the lid, which may be connected to a cooling structure for dissipating the heat. However, in scaled down IC devices, a thinner TIM layer (e.g. due to reduced space between an IC chip and a lid) may provide an inefficient thermal conduction from the IC chip to the lid.

Attempts to improve the thermal performance of the package include replacing the TIM with a material having a lower thermal resistance, such as silver or gold alloys. However, the cost of such materials may be cost prohibitive for typical IC lids and the hardness of the materials may increase cracking of the IC chip. Alternatively, the lid thickness may be reduced to lower the lid's thermal resistance, but then the IC chip becomes more vulnerable to cracking.

Therefore, a need exists for methodology enabling a more efficient heat transfer from an IC chip to its lid and the resulting devices.

SUMMARY

An aspect of the present disclosure is a method for reducing the junction temperature by forming spacers on an IC chip in a TIM layer between the IC chip and its lid.

Another aspect of the present disclosure is a device having a reduced junction temperature including spacers on an IC chip in a TIM layer between the IC chip and its lid.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a substrate, including IC devices, having front and back sides; forming vertical spacers on the backside of the substrate; providing a plate parallel to and spaced from the backside of the substrate; and forming a TIM layer, surrounding the vertical spacers, between the backside of the substrate and the plate.

In one aspect forming the vertical spacers includes forming a seed layer on the backside of the substrate; electroplating vertical structures on the seed layer through a mask layer; and removing exposed sections of the seed layer, exposing sections of the backside of the substrate.

Another aspect includes forming the vertical spacers to a height less than a thickness of the TIM layer.

A further aspect includes forming the vertical spacers to a height connecting the backside of the substrate to the plate.

One aspect includes forming the vertical spacers spaced from each other, in rows and columns.

An additional aspect includes forming the vertical spacers based on properties of the TIM layer.

Another aspect includes forming the vertical spacers having dimensions and spacing based on a thermal dissipation target associated with the substrate.

A further aspect includes forming the vertical spacers of a metallic material.

In one aspect, the plate is a heat dissipating surface.

Another aspect of the present disclosure includes a device including: a substrate, including integrated circuit devices, having front and back sides; vertical spacers on the backside of the substrate; a plate parallel to and spaced from the backside of the substrate; and a TIM layer, surrounding the vertical spacers, in a space between the backside of the substrate and the plate.

In one aspect, the vertical spacers have a height less than a thickness of the TIM layer.

In another aspect, the vertical spacers connect the backside of the substrate to the plate.

In a further aspect, the vertical spacers are spaced from each other and form adjacent rows and columns.

In an additional aspect, the vertical spacers are formed based on properties of the TIM.

In one aspect, the vertical spacers have dimensions and spacing based on a thermal dissipation target associated with the substrate.

In another aspect, the vertical spacers are formed of a metallic material.

In a further aspect, the plate is a heat dissipating surface.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of insufficient thermal conduction attendant upon using a conventional TIM layer between an IC substrate and a lid. The present disclosure addresses and solves such problems, for instance, by, inter alia, forming spacers, on the substrate in the TIM layer, to facilitate a more efficient heat transfer from the substrate to the lid.

Figure 1A:
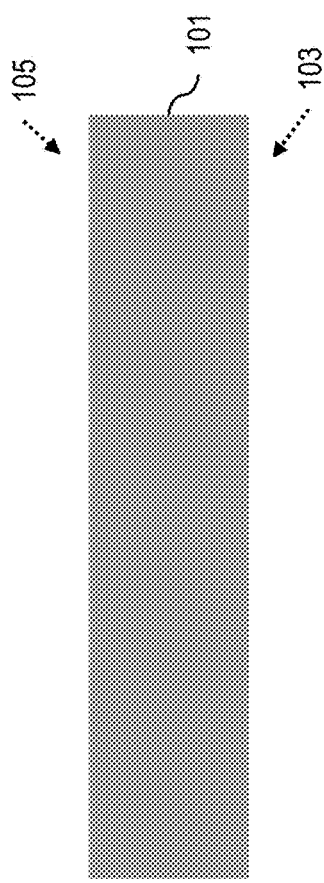
FIGS. 1A through 1F illustrate cross sectional views of a process for forming spacers on a substrate in a TIM layer, in accordance with an exemplary embodiment.

FIG. 1A illustrates a cross-sectional view of a substrate 101 having front and back sides, 103 and 105, respectively. The substrate includes integrated components and elements (not shown for illustrative convenience) forming an IC chip/die. The backside 105 may be a silicon (Si) substrate surface.

Figure 1B:
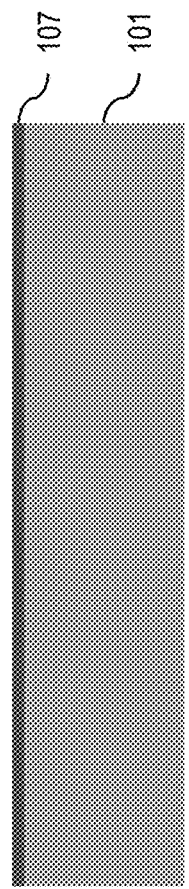

In FIG. 1B, a seed layer 107 (e.g. copper) is formed (e.g. by sputter coating) on the backside of the substrate 101.

Figure 1C:
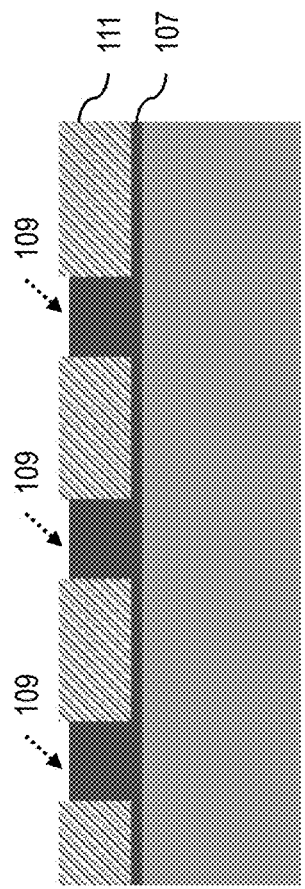

As illustrated in FIG. 1C, spacers/studs 109 may be formed (e.g. by electroplating a metallic material such as copper), through openings in a photomask 111, on selective areas over the seed layer 107.

Figure 1D:
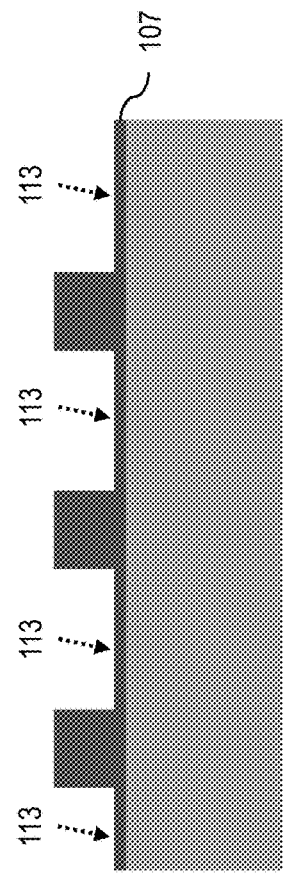
Figure 1E:
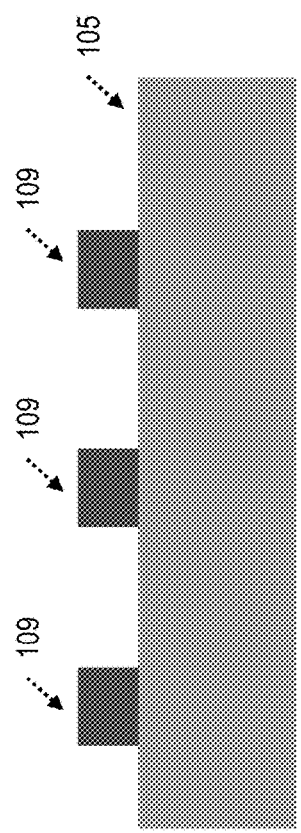

In FIG. 1D, the photomask 111 is stripped. Exposed sections 113 of the seed layer 107 are then removed to expose sections of the backside 105 of the substrate 101, as illustrated in FIG. 1E. FIG. 1E illustrates the spacers 109 formed on the backside 105.

Figure 1F:
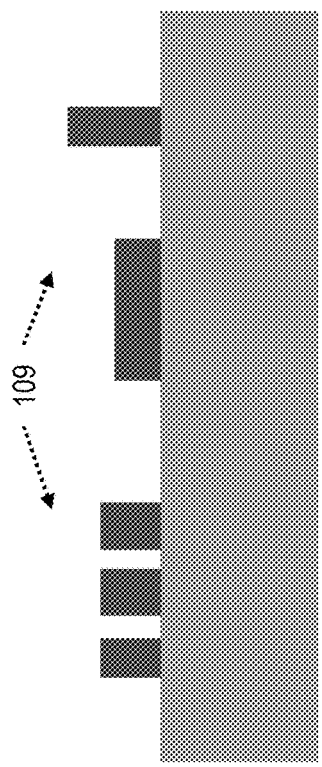

As illustrated in FIG. 1F, the spacers 109 may be formed to have a same or different height and/or width and may be spaced at a same or different distance from each other.

Figure 1G:
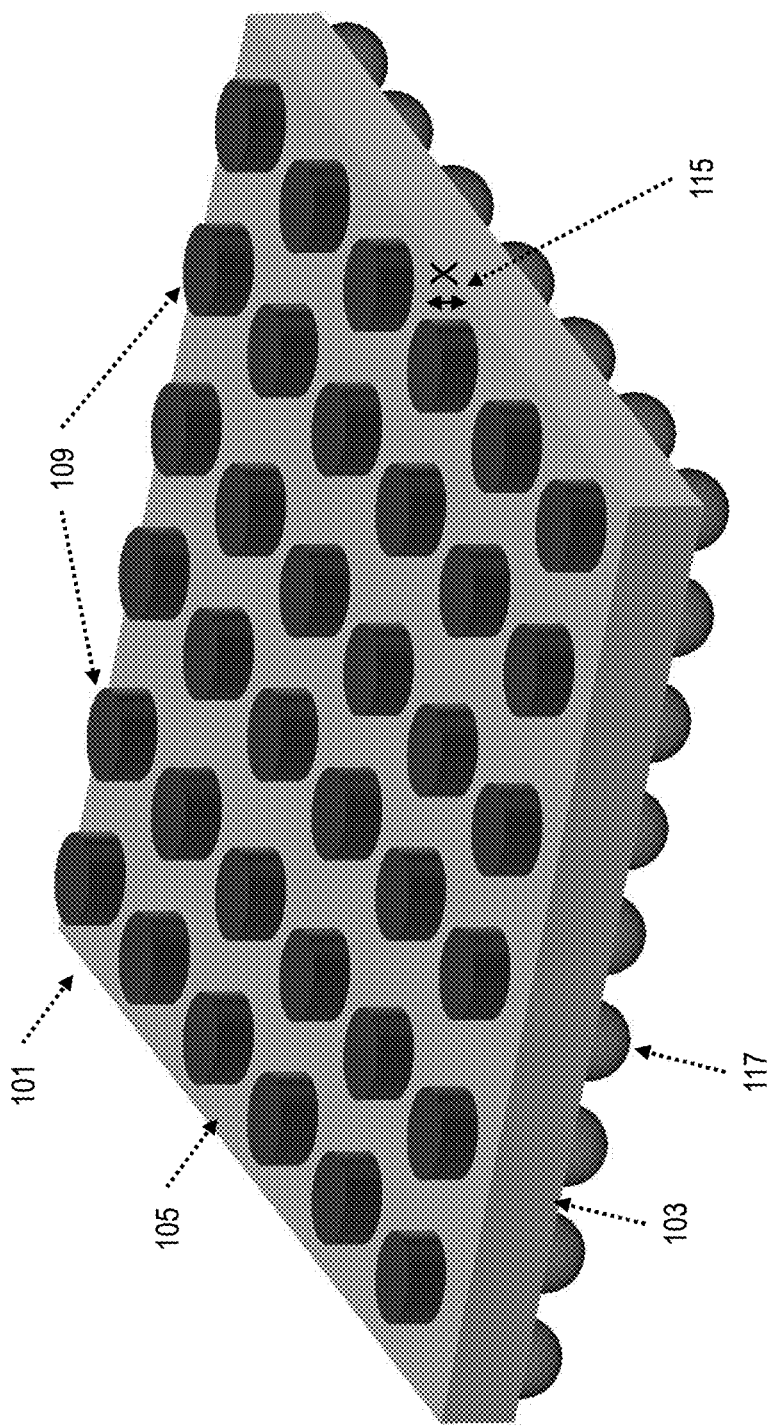
FIGS. 1G through 1I illustrate three-dimensional views of spacers on a substrate in a TIM layer between the substrate and a lid, in accordance with an exemplary embodiment.

FIG. 1G illustrates a three-dimensional view of the spacers 109 formed, in rows and columns, on the backside 105 of the substrate 101. The spacers 109 may be formed to a height X 115. Solder balls 117 may be formed on a front-side 103 of the substrate 101, for example, to mount the IC chip onto an interface board.

Figure 1H:
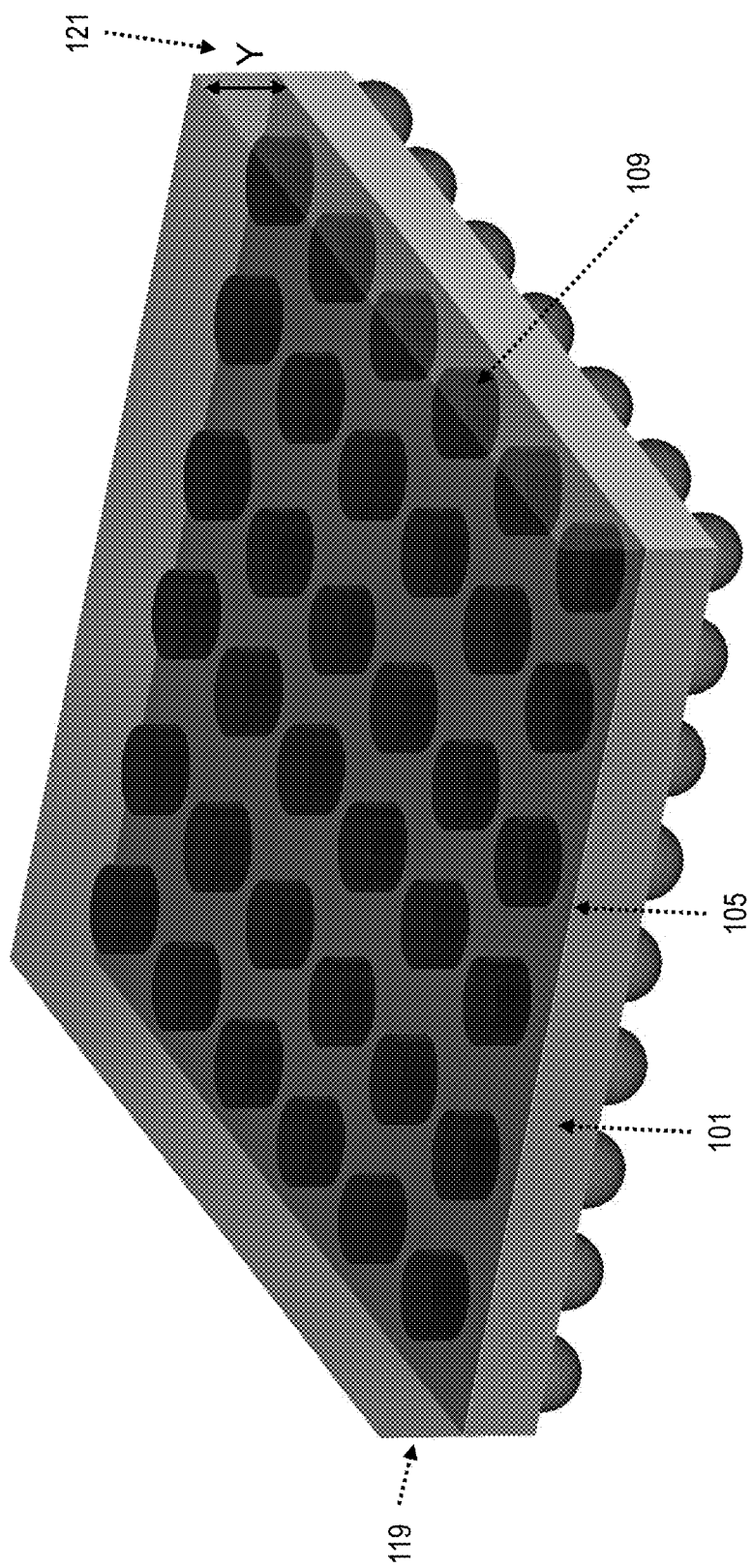

In FIG. 1H, a TIM layer 119 is formed/dispensed on the backside 105 of the substrate 101, to a height Y 121, surrounding the spacers 109.

Figure 1I:
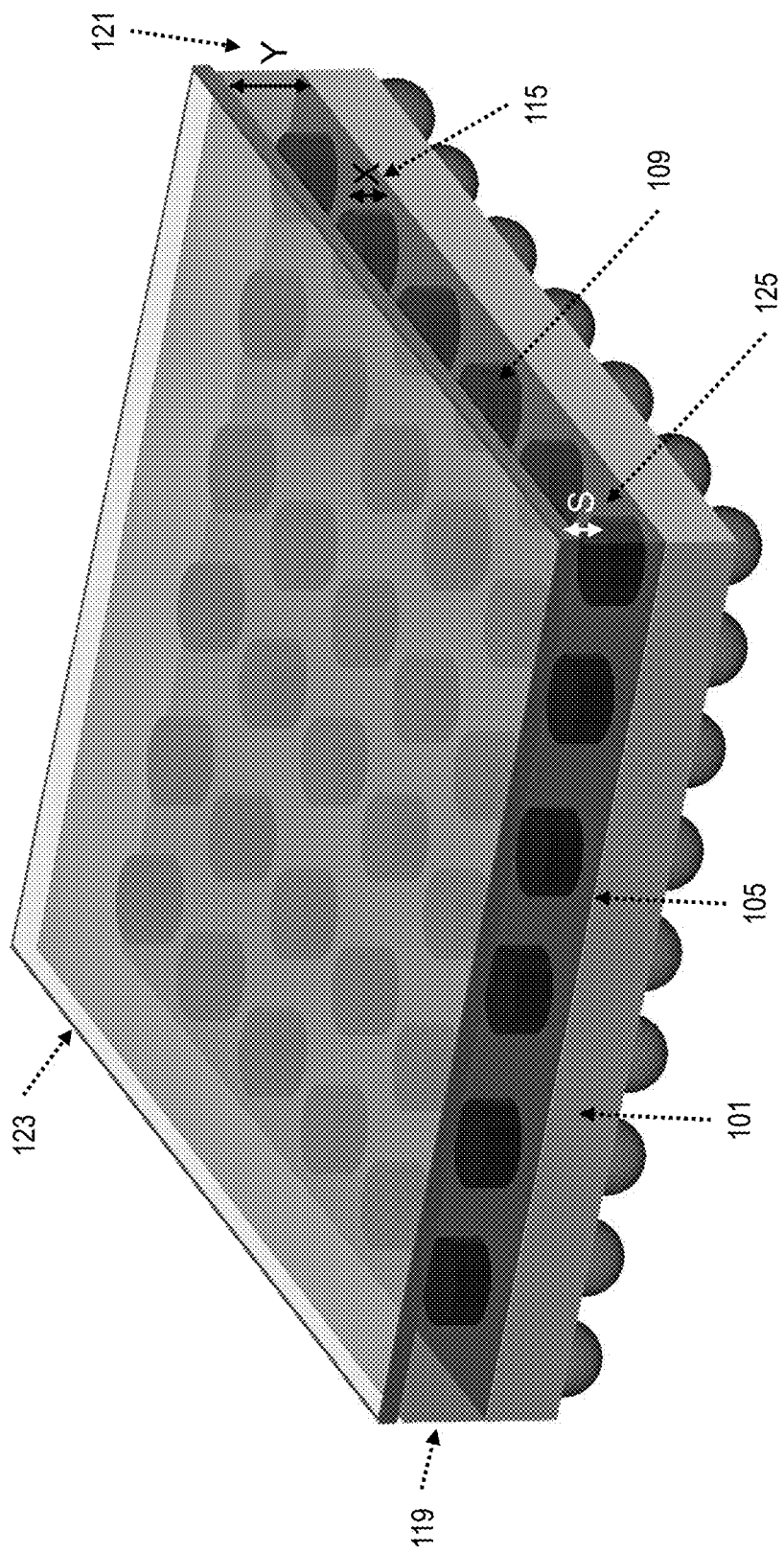

FIG. 1I illustrates a plate/lid 123 (e.g. part of an IC chip packaging) above and parallel to the TIM layer 119. A height S 125 between an upper surface of the spacers 109 and a lower surface of the lid 123 is the difference between the height Y 121 and the height X 115 of the spacers 109 (e.g. S=Y−X). The heat generated by the IC components in the substrate 101 may be transferred to the lid 123 (e.g. at height Y 121) through height X 115 of the spacers 109 and then through height S 125 in the TIM layer 119.

As previously noted, the spacers 109 may also be formed to a full height (e.g. height Y) such that they connect to a lid 123 for a direct heat transfer from the substrate 101 to the lid 123. The metal spacers 109 reduce the thermal resistance between the substrate 101 and the lid 123. The thermal resistance may be further reduced (e.g. for a better heat transfer) by increasing the height of the spacers 109 (which decreases the thermal resistance of the spacers). For example, an increase in height from zero to the full thickness of the TIM can yield a 34% decrease in the thermal resistance.

Dimensions and spacing of the spacers 109 may be based on the material used to form the spacers 109, characteristics/properties of the TIM layer 119, the thermal dissipation target associated with the substrate 101, or the like criteria. For example, increasing the metal density from zero to 64% can yield a 14% decrease in the thermal resistance.

The embodiments of the present disclosure can achieve several technical effects including improved thermal performance of an IC package by forming spacers (e.g. heat transfer pipes) on a backside of an IC chip to reduce the thermal resistance of a TIM layer and provide a more efficient heat transfer from the IC chip to a lid. A thinner TIM layer may be used without a need for complex lid designs in 2D, 2.5D, and 3D IC packages. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a substrate, including integrated circuit devices, having front and back sides;
   forming a seed layer on the back side of the substrate;
   forming vertical spacers spaced from each other, in rows and columns on the seed layer, each vertical spacer having a first end contacting the seed layer and a second end opposite the first end in a vertical direction from the seed layer, wherein forming the vertical spacers comprises: electroplating vertical structures on the seed layer through a mask layer; and removing exposed sections of the seed layer, exposing sections of the back side of the substrate;
   providing a plate parallel to and spaced from the back side of the substrate; and
   forming a thermal interface material (TIM) layer, surrounding the vertical spacers, between the back side of the substrate and the plate,
   wherein every vertical spacer surrounded by the TIM layer extends from the first end to the second end with no intervening structure between the first end and the second end.

2. The method according to claim 1, comprising forming the vertical spacers to a height less than a thickness of the TIM layer.

3. The method according to claim 1, comprising forming the vertical spacers to a height connecting the back side of the substrate to the plate.

4. The method according to claim 1, comprising forming the vertical spacers based on properties of the TIM layer.

5. The method according to claim 1, comprising forming the vertical spacers having dimensions and spacing based on a thermal dissipation target associated with the substrate.

6. The method according to claim 1, comprising forming the vertical spacers of a metallic material.

7. The method according to claim 1, wherein the plate is a heat dissipating surface.

8. A method comprising:
   providing a substrate, including integrated circuit devices, having front and back sides;
   forming a seed layer on the back side of the substrate;
   forming metallic vertical spacers, on the seed layer, spaced from each other in rows and columns, each metallic vertical spacer having a first end contacting the seed layer and a second end opposite the first end in a vertical direction from the seed layer, wherein forming the vertical spacers comprises electroplating vertical structures on the seed layer through a mask layer; and
   removing exposed sections of the seed layer, exposing sections of the back side of the substrate;
   providing a plate parallel to and spaced from the back side of the substrate; and
   forming a thermal interface material (TIM) layer, surrounding the metallic vertical spacers, between the back side of the substrate and the plate,
   wherein every metallic vertical spacer surrounded by the TIM layer extends from the first end to the second end with no intervening structure between the first end and the second end.

9. The method according to claim 7, comprising forming the metallic vertical spacers having dimensions and spacing based on a thermal dissipation target associated with the substrate, properties of the TIM layer, or a combination thereof.

* * * * *